(12) United States Patent
Noh et al.

(10) Patent No.: US 10,879,231 B2
(45) Date of Patent: Dec. 29, 2020

(54) ESD PROTECTION SILICON CONTROLLED RECTIFIER DEVICE

(71) Applicant: DB HITEK CO., LTD., Seoul (KR)

(72) Inventors: Seok Soon Noh, Paju-si (KR); Joon Tae Jang, Seoul (KR); Joon Hyeok Byeon, Bucheon-si (KR); Young Chul Kim, Seongnam-si (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 16/385,483

(22) Filed: Apr. 16, 2019

(65) Prior Publication Data

US 2019/0319024 A1 Oct. 17, 2019

(30) Foreign Application Priority Data

Apr. 17, 2018 (KR) .......................... 10-2018-0044474

(51) Int. Cl.
*H01L 27/02* (2006.01)
*H01L 29/66* (2006.01)
*H01L 29/74* (2006.01)

(52) U.S. Cl.
CPC .... *H01L 27/0262* (2013.01); *H01L 29/66363* (2013.01); *H01L 29/74* (2013.01)

(58) Field of Classification Search
CPC ................................................. H01L 27/0262
See application file for complete search history.

(56) References Cited

U.S. PATENT DOCUMENTS

| 9,991,369 | B2 | 6/2018 | Noh et al. |
| 10,276,557 | B2 | 4/2019 | Han et al. |
| 2006/0043487 | A1* | 3/2006 | Pauletti ................... H01L 29/87 257/355 |
| 2006/0223257 | A1 | 10/2006 | Williams et al. |
| 2011/0176244 | A1 | 7/2011 | Gendron et al. |
| 2011/0303947 | A1 | 12/2011 | Salcedo et al. |
| 2013/0285112 | A1* | 10/2013 | Lee ..................... H01L 29/7436 257/109 |
| 2013/0328103 | A1 | 12/2013 | Salcedo |
| 2014/0339601 | A1* | 11/2014 | Salcedo ............. H01L 29/7436 257/140 |

(Continued)

*Primary Examiner* — Moazzam Hossain
(74) *Attorney, Agent, or Firm* — Patterson Thuente Pedersen, P.A.

(57) ABSTRACT

An ESD protection SCR device includes an epitaxial layer provided on a P-type semiconductor substrate, the epitaxial layer having the P-type conductivity, element isolation layers provided on the epitaxial layer, the element isolation layers dividing the epitaxial layer into an anode region and a cathode region, a first well of an N-type conductivity, provided in a portion of the epitaxial layer corresponding to the anode region, a first impurity region provided on a surface of the first well, the first impurity region being connected to an anode terminal and having a high concentration P-type conductivity, a second well of the P-type conductivity, provided in a portion of the epitaxial layer corresponding to the cathode region, a second impurity region provided on a surface of the second well, the second impurity region being connected to a cathode terminal and having a high concentration N-type conductivity, and a floating well of the N-type conductivity, buried in the epitaxial layer.

10 Claims, 3 Drawing Sheets

(56) References Cited

U.S. PATENT DOCUMENTS

| | | | |
|---|---|---|---|
| 2015/0187749 A1* | 7/2015 | Dai .................. | H01L 29/66121 |
| | | | 257/173 |
| 2017/0250174 A1* | 8/2017 | Xiu ..................... | H01L 27/0629 |
| 2018/0175020 A1* | 6/2018 | Dissegna .............. | H01L 29/861 |

* cited by examiner

ESD PROTECTION SILICON CONTROLLED RECTIFIER DEVICE

CROSS-REFERENCE TO RELATED APPLICATION

This application claims priority to Korean Patent Application No. 10-2018-0044474, filed on Apr. 17, 2018 and all the benefits accruing therefrom under 35 U.S.C. § 119, the contents of which are incorporated by reference in their entirety.

TECHNICAL FIELD

The present disclosure relates to an electrostatic discharge protection silicon controlled rectifier device. More particularly, the present disclosure relates to a silicon controlled rectifier device for protecting a core circuit from an electrostatic discharge.

BACKGROUND

In general, various devices such as a thyristor, a DMOS transistor (Double-diffusion Metal Oxide Semiconductor transistor), or a bipolar transistor are used as a high-voltage electrostatic discharge (hereinafter, referred as "ESD") protection device.

As a typical example of the thyristor device, a typical silicon controlled rectifier (SCR) device includes an anode and a cathode, and generates a lateral current in which charges flow in the lateral direction.

FIG. 1 is a cross-sectional view illustrating a conventional ESD protection SCR device.

Referring to FIG. 1, a conventional SCR device 10 includes a deep well 12 having n-type conductivity on an epitaxial layer 11 of p-type conductivity. A first well 13 is formed by implanting n-type impurities into one side portion of the deep well 12, and a second well 14 is formed by implanting p-type impurities into another side portion of the deep well 12.

The region where the first well 13 is formed defines an anode region and the region where the second well 14 is formed defines a cathode region. The anode region and the cathode region are separated from each other by an element isolation layer.

A high concentration P++ anode 16 is formed by implanting p-type impurities into the first well 13, whereas a high concentration N++ cathode 19 is formed by implanting n-type impurities into the second well 14. The anode 16 is connected to an anode terminal 23, while the cathode 19 is connected to a cathode terminal 24.

N-type impurities are implanted in the first well 13 and between the anode 16 and the element isolation layer to form N++ floating anodes 15 and 17. Conversely, P-type impurities are implanted into the second well 14 and between the cathode 19 and the element isolation layer to form P++ floating cathodes 18 and 20.

The anode 16 is connected to a $V_{dd}$ terminal of a core circuit (not shown) in order to use the SCR device 10 for suppressing ESD as an electrostatic discharge suppressing device. The cathode 20 is connected to a ground terminal.

That is, the SCR device 10 for suppressing ESD is connected to the core circuit to protect the core circuit from electrostatic discharge. When the electrostatic voltage is applied to the core circuit by over 2 kV, the SCR device 10 for suppressing ESD, connected to the core circuit, may quickly remove electrostatic charges via the cathode 20 to the ground terminal.

In the anode region, a PNP transistor is defined in which the anode 16 serves as an emitter, the first well 13 serves as a base, and the second well 14 serves as a collector. On the other hand, in the cathode region, the cathode 19 serves as an emitter, the epitaxial layer 11 connected to the second well 14 functions as a base, and the deep well 12 serves as a collector to define an NPN transistor.

As the epitaxial layer 11 is made thicker, a resistance of the epitaxial layer 11 may decrease proportionally. Thus, a current in a vertical direction, that is, a vertical current, increases through the epitaxial layer 11 serving as the base of the NPN transistor. Therefore, the leakage current which flows along the vertical direction increases, whereas a current in the lateral direction may decrease, and a gain of the NPN transistor deteriorates.

As a result, the positive feedback of the SCR device 10 for suppressing ESD, including the NPN transistor and the PNP transistor, may be reduced, and the ESD protection SCR device 10 may operated distortedly.

SUMMARY

Embodiments of the present invention include an SCR device for suppressing an electrostatic discharge capable of decreasing a vertical current to improve a gain thereof.

According to an example embodiment, an ESD protection SCR device includes an epitaxial layer provided on a P-type semiconductor substrate, the epitaxial layer having the P-type conductivity, element isolation layers provided on the epitaxial layer, the element isolation layers dividing the epitaxial layer into an anode region and a cathode region, a first well of an N-type conductivity, provided in a portion of the epitaxial layer corresponding to the anode region, a first impurity region provided on a surface of the first well, the first impurity region being connected to n anode terminal and having a high concentration P-type conductivity a second well of the P-type conductivity, provided in a portion of the epitaxial layer corresponding to the cathode region, a second impurity region provided on a surface of the second well, the second impurity region being connected to a cathode terminal and having a high concentration N-type conductivity, and a floating well of the N-type conductivity, buried in the epitaxial layer.

In an example embodiment, the floating well may be disposed between the anode region and the cathode region.

In an example embodiment, the floating well may have a vertical position adjustable along a vertical direction perpendicular to an upper surface of the semiconductor substrate.

In an example embodiment, the floating well may include at least one opening therethrough.

In an example embodiment, the second impurity region, the epitaxial layer and the first well may define an emitter, a base and a collector, respectively, and the floating well increases a resistance of the base to decrease a vertical current which flows along the epitaxial layer.

In an example embodiment, the ESD protection SCR device may further include a third impurity region of the N-type conductivity having a high concentration, the third impurity region being provided on a surface of the first well so as to surround the first impurity region, a fourth impurity region of the P-type conductivity having a high concentration, the fourth impurity region being provided on a surface of the second well so as to be spaced apart from the second impurity region and connected to a bulk to al, and a fifth impurity region of the P-type conductivity having a high-concentration, the fifth impurity region being provided on the surface of the second well so as to surround one side of the second impurity region, adjacent to the anode region.

In an example embodiment, the ESD protection SCR device may further include a shallow well of the N-type conductivity, the shallow well being positioned in the first well and under the third impurity region.

In an example embodiment, the first well may have a ring structure and may surround the second well.

In an example embodiment, the ESD protection SCR device may further include a drift ion region of the N-type conductivity, provided at both sides of the first well, and a gate provided on both a surface of the second well and between the drift ion region and the fifth impurity region and a surface of the element isolation layer, the gate being connected to a gate terminal.

Here, the ESD protection SCR device may further include a P-body region disposed under a portion of the gate and a portion of the fifth impurity region.

In an example embodiment, the element isolation layers may additionally separate the epitaxial layer into a P-sub region, and the ESD protection SCR device may further include a third well of the P-type conductivity, the third well being disposed in the epitaxial layer of the P-sub region, and a sixth impurity region of the P-type conductivity having a high-concentration, the sixth impurity region being provided on a surface of the third well and being connected to a P-sub terminal.

According to an example embodiment, an ESD protection SCR device includes an epitaxial layer provided on a P-type semiconductor substrate, the epitaxial layer having the P-type conductivity, an element isolation layer provided on the epitaxial layer, the element isolation layer separating the epitaxial layer into an anode region and a cathode region, a first well of an N-type conductivity provided in a portion of the epitaxial layer corresponding to the anode region, a first impurity region provided on a surface of the first well, the first impurity region being connected to an anode terminal and having a high concentration P-type conductivity, a second well of the P-type conductivity provided in a portion of the epitaxial layer corresponding to the cathode region, a second impurity region provided on a surface of the second well, the second impurity region being connected to a cathode terminal and having a high concentration N-type conductivity, a floating well of the N-type conductivity, buried in the epitaxial layer, and a shallow well positioned at a lower portion of the first well and spaced apart from the first impurity region, the shallow well having the N-type conductivity.

According to some example embodiments, the ESD protection SCR device includes the floating well having the N-type conductivity which is buried in the epitaxial layer having the P-type conductivity with being maintained in the floating state so that the base resistance of the epitaxial layer may be increased. Therefore, a value of the vertical current which flows through the epitaxial layer is reduced, whereas a value of the horizontal current which flow in the lateral direction may be increased. Thus, the gain of the ESD protection SCR device may be improved.

BRIEF DESCRIPTION OF THE DRAWINGS

Example embodiments can be understood in more detail from the following description taken in conjunction with the accompanying drawings, in which.

Figure 1:
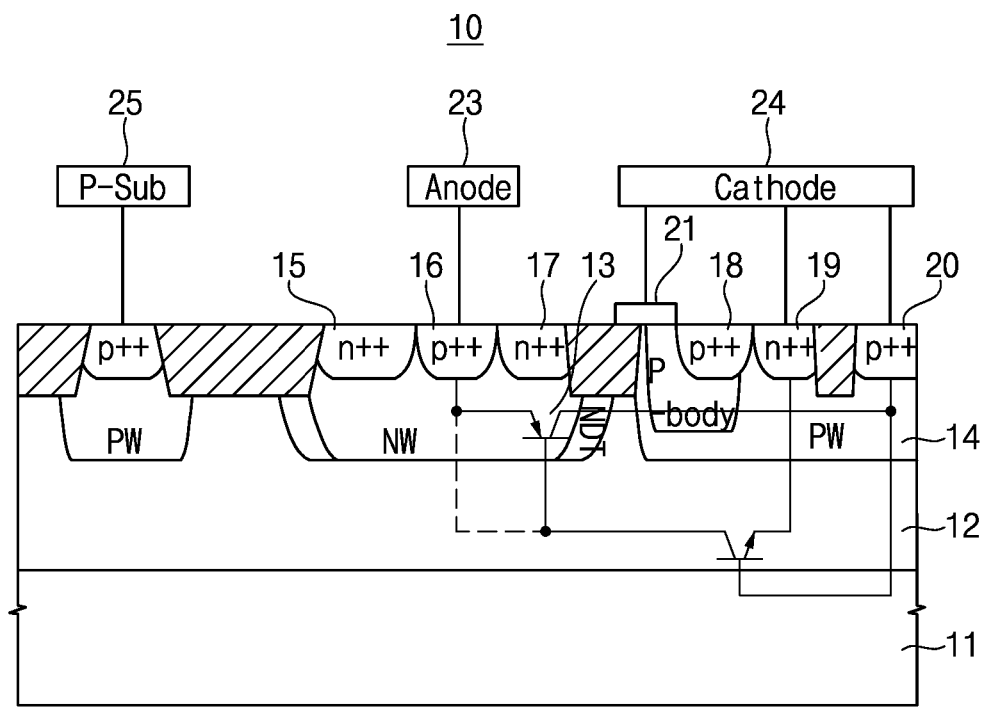
FIG. 1 is a cross-sectional view illustrating a conventional ESD protection SCR device.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION OF EMBODIMENTS

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, films, regions or plates may also be present. Unlike this, it will also be understood that when a layer, a film, a region or a plate is referred to as being 'directly on' another one, it is directly on the other one, and one or more intervening layers, films, regions or plates do not exist. Also, though terms like a first, a second, and a third are used to describe various components, compositions, regions and layers in various embodiments of the present invention are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present invention. Accordingly, changes in the shapes of the diagrams, for example, changes in manufacturing techniques and/or allowable errors, are sufficiently expected. Accordingly, embodiments of the present invention are not described as being limited to specific shapes of areas described with diagrams and include deviations in the shapes and also the areas described with drawings are entirely schematic and their shapes do not represent accurate shapes and also do not limit the scope of the present invention.

Figure 2:
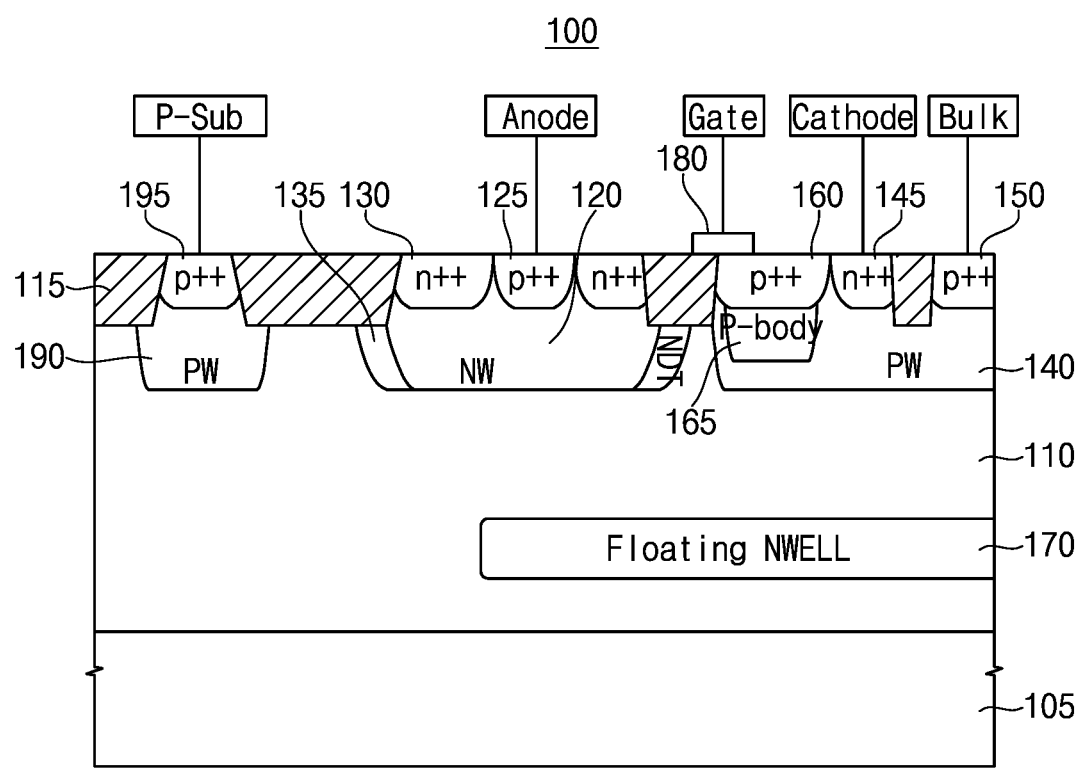
FIG. 2 is a cross-sectional view illustrating an ESD protection SCR device in accordance with an example embodiment of the present invention.

FIG. 2 is a cross-sectional view illustrating an ESD protection SCR device in accordance with an embodiment.

Referring to FIG. 2, according to an embodiment, an ESD protection SCR device 100 includes a semiconductor substrate 105 having a P-type conductivity, an epitaxial layer 110, element isolation layers 115, a first well 120, a first impurity region 125, a second well 140, a second impurity region 145, and a floating well 170.

The epitaxial layer 110 is disposed on the semiconductor substrate 105. The epitaxial layer 110 has a P-type conductivity. The epitaxial layer 110 may be formed by an epitaxial growth process in one embodiment.

The element isolation layers 115 are provided on an upper surface portion of the epitaxial layer 110. The element isolation layers 115 may divide the semiconductor substrate 105 into an anode region and a cathode region. Further, the element isolation layers 115 may additionally divide the semiconductor substrate into a P-sub region. Here, the cathode region may be located in a center region of the semiconductor substrate 105, and the anode region and the P-Sub region may be located in peripheral regions positioned outside from the cathode region of the semiconductor substrate 105.

The element isolation layers 115 may have a shallow trench isolation (STI) structure or a local oxidation structure (LOCOS). The isolation layers 115 may be a plurality of oxide layers.

The first well 120 is disposed on the upper surface portion of the epitaxial layer 110 and in the anode region. The first well 120 may have a certain depth. For example, the first well 120 has a depth larger than that of the element isolation layers 115. The first well 120 may have an N-type conductivity.

The first impurity region 125 is positioned at a surface portion of the first well 120 at a predetermined depth. The first impurity region 125 is formed by implanting high-concentration P-type impurities into the surface portion of the first well 120. That is, the first impurity region 125 may be doped with impurities to have a higher impurity concentration than that of the first well 120. The first impurity region 125 is connected to an anode terminal.

The second well 140 is provided at the surface portion of the epitaxial layer 110 and in the cathode region. The second well 140 may have a predetermined depth, for example, deeper than the element isolation layers 115. The second well 140 may have the P-type conductivity.

The second impurity region 145 is disposed at an upper surface portion of the second well 140 with a predetermined depth. The second impurity region 145 is formed by implanting high-concentration N-type impurities. That is, the second impurity region 145 may be doped at an impurity concentration higher than that of the second well 120. The second impurity region 145 is connected to a cathode terminal.

The floating well 170 is buried in the epitaxial layer 110. The floating well 170 is not electrically connected to a specific terminal, and thus maintains an electrically floating state. The floating well 170 has the N-type conductivity. That is, the floating well 170 is buried in the epitaxial layer 110 and is kept in the floating state with having N-type conductivity, so that an entire resistance of the epitaxial layer 110 is increased. As a result, the floating well 170 may reduce a value of a vertical current (i.e., current that flows vertically through the epitaxial layer 110).

For example, in the anode region, a PNP transistor is defined in which the first impurity region 125 serves as an emitter, the first well 120 serves as a base, and the epitaxial layer 110 serves as a collector. On the other hand, in the cathode region, the second impurity region 145 serves as an emitter, the epitaxial layer 110 connected to the second well 140 functions as a base, and the first well 120 serves as a collector to define an NPN transistor.

In the case where the epitaxial layer 110 is made thicker, a resistance of the epitaxial layer 110 may decrease. Thus, a current which flows in a vertical direction, that is, a vertical current, increases through the epitaxial layer 110 which serves as the base of the NPN transistor. Therefore, the leakage current which flows along the vertical direction increases, whereas a lateral current in the lateral direction may relatively decreases, and a gain of the NPN transistor may deteriorate.

In some embodiments of the present invention, the floating well 170 of the N-type conductivity is buried in the epitaxial layer 110 having the P-type conductivity and is maintained in the floating state, so that the resistance of the epitaxial layer 110, which corresponds to a base resistance of NPN transistor is increased. As a result, the value of the vertical current flowing through the epitaxial layer 110 and through the floating well 170 is reduced, whereas the value of the lateral current may be increased. Thus, the gain of the ESD protection SCR device 100 may be increased.

In an example embodiment of the present invention, the floating well 170 is located across both the anode region and the cathode region. Thus, the vertical current which flows through the epitaxial layer 110 serving as the base of the NPN transistor may be effectively reduced.

In an example embodiment of the present invention, the floating well 170 may have a vertical position that is adjustable along the vertical direction in the epitaxial layer 110. That is, when the vertical position of the floating well 170 approaches to the first well 120 and the second well 140, the vertical current may be effectively reduced.

In an example embodiment of the present invention, the ESD protection SCR device may further include a third impurity region 130 positioned in the anode region.

The third impurity region 130 is formed by implanting high-concentration N-type impurities into the upper surface portion of the first well 120 with a predetermined depth. The third impurity region 130 may be maintained in a floating state without being connected to the anode terminal. As a result, the base resistance of the PNP transistor may increase when the first well 120 functions as the base of the PNP transistor. Thus, a trigger voltage $V_{t1}$ of the ESD protection SCR device 100 may be reduced. Therefore, in the ESD protection SCR device 100, the trigger voltage $V_{t1}$ is relatively lower than a breakdown voltage $V_{t2}$, so that the ESD protection SCR device 100 may operate more stably. Here, the trigger voltage $V_{t1}$ is defined as a voltage at which the SCR device 100 starts to operate, and the breakdown voltage $V_{t2}$ is defined as a voltage at which the SCR device 100 breaks down due to a heat generation.

The third impurity region 130 may have a ring structure and may surround the first impurity region 125. The third impurity region 130 is located at a periphery of the first impurity region 125 to suppress holes injected from the anode terminal from flowing along an interface between the element isolation layers 115 and the epitaxial layer 110. Therefore, the interface between the element isolation layers 115 and the epitaxial layer 110 may be prevented from being damaged by the holes. As a result, the breakdown voltage $V_{t2}$ of the ESD protection SCR device 100 may increase.

The holes may be recombined with the electrons in the third impurity region 130 before the holes injected from the first impurity region 125 are collected through the first well 120 to the epitaxial layer 110. Therefore, the gain of the PNP may be reduced to increase a holding voltage.

In an embodiment, the SCR device 100 may further include a fourth impurity region 150 and a fifth impurity region 160 disposed in the cathode region.

The fourth impurity region 150 is formed by implanting high concentration P-type impurities into the surface portion of the second well 140 with a predetermined depth. The fourth impurity region 150 is connected to a bulk terminal.

The fourth impurity region 150 may be spaced apart from the second impurity region 145. For example, one of the element isolation layers 115 may be located between the second impurity region 145 and the fourth impurity region 150.

The fifth impurity region 160 is formed by implanting high-concentration P-type impurities into the second well 140 with a predetermined depth. The fifth impurity region 160 may be in a floating state without being connected to the cathode terminal. Further, the fifth impurity region 160 is disposed adjacent to the second impurity region 145. The fifth impurity region 160 surrounds one side of the second impurity region 145, which is adjacent to the anode region. The fifth impurity region 160 may increase the holding voltage.

On the other hand, the first well 120 may have a ring structure to surround the second well 140. Accordingly, the first well 120 may serve to block a leakage current generated in the second well 140.

The SCR device 100 according to an embodiment of the present invention may further include a third well 190 and a sixth impurity region 195.

The third well 190 is formed in a portion of the epitaxial layer 110, which correspond to the P-Sub region. The third well 190 may have a depth, for example, deeper than that of the element isolation layers 115. The third well 190 may have the P-type conductivity.

The sixth impurity region 195 is formed by implanting high concentration P-type impurities into a surface portion of the third well 190 with a predetermined depth. The sixth impurity region 195 is connected to the P-Sub terminal.

The third well 190 has a ring structure and may surround both the first well 120 and the second well 140, such that the sixth impurity region 190 may have the same ring structure. Since the sixth impurity region 190 has the ring structure, the SCR device 100 may internally operate, prior to a parasitic operation of peripheral elements. Therefore, the operation of the SCR element 100 may be further stabilized.

In an example embodiment of the present invention, the SCR device 100 may further include an N-type drift ion region 135 and a P-body region 165.

The N-type drift ion region 135 is disposed on both sides of the first well 120. Further, the N-type drift ion region 135 may be located below the element isolation layers 115. The N-type drift ion region 135 may have an impurity concentration lower than that of the first well 120.

The P-body region 165 is formed by implanting high concentration P-type impurities into the second well 140 and is located under a lower surface portion of the fifth impurity region 160. The P-body region 165 may be added to the fifth impurity region 160 to increase an N/P recombination and reduce the gain of the NPN transistor and consequently increase the holding voltage.

Accordingly, the trigger voltage $V_{t1}$ and the breakdown voltage $V_{t2}$ may be adjusted using the N-type drift ion region 135, and the holding voltage may be increased using the P-body region 170.

In an example embodiment of the present invention, the SCR device 100 may further include a gate 180.

The gate 180 is provided on a surface of the second well 140 and a surface of one of the element isolation layers 115, and the gate 180 is located between the N type drift ion region 135 and the fifth impurity region 160. That is, the gate 180 may be disposed over a junction region between the N-type drift ion region 135 and the fifth impurity region 160. Also, the gate 185 is connected to the gate terminal.

Since the gate 180 may cause an effect of forming a current path, an electric field may be prevent from being concentrated on a lower portion of the gate 180. That is, the gate 180 has a RESURF (reduced surface field) effect. Therefore, the gate 180 may adjust the breakdown voltage $V_{t2}$.

Figure 3:
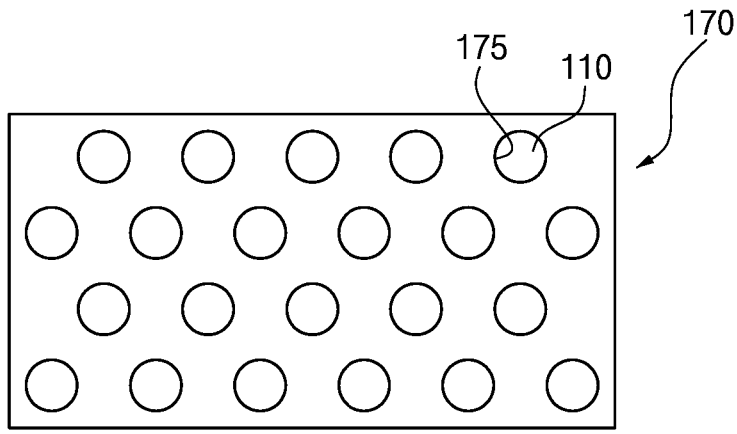
FIG. 3 is a plan view illustrating the floating well of FIG. 2.

FIG. 3 is a plan view illustrating the floating well of FIG. 2.

Referring to FIG. 3, the floating well 170 may include at least one opening 175 therein. The opening 175 is filled with a material of the epitaxial layer 110 having the P-type conductivity. Thus, when the epitaxial layer 110 functions as the base of the NPN transistor, the resistance of the base may be effectively controlled.

Figure 4:
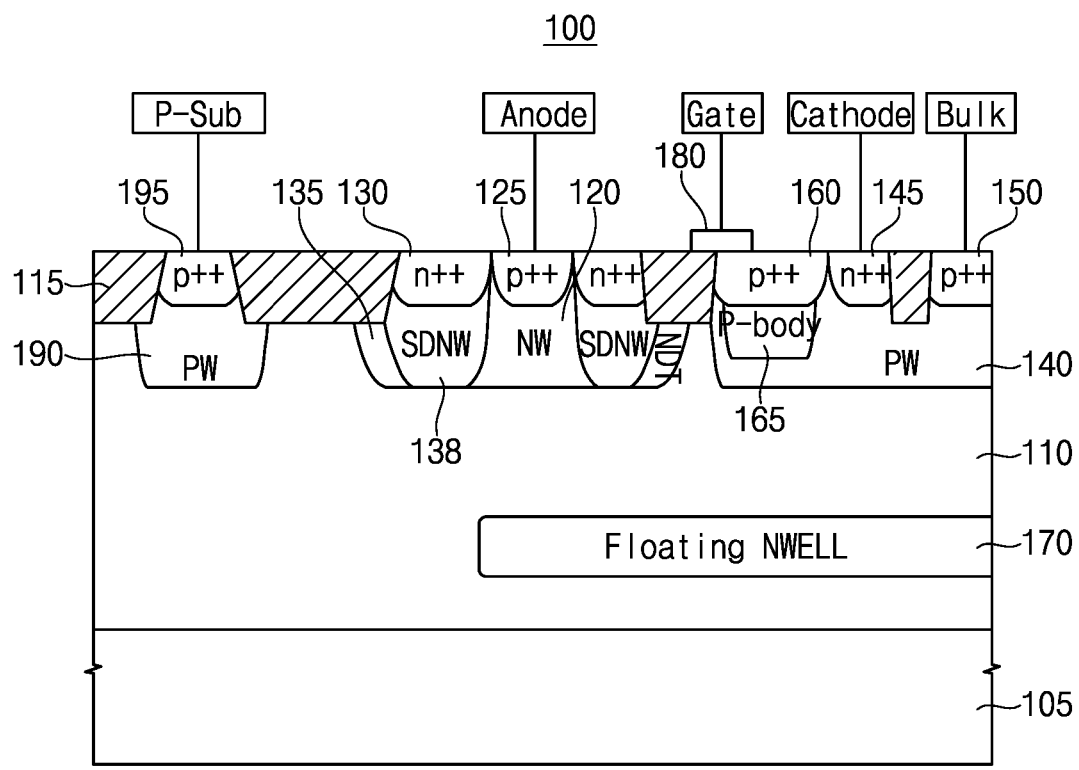
FIG. 4 is a cross-sectional view illustrating an ESD protection SCR device in accordance with an example embodiment of the present invention.

FIG. 4 is a cross-sectional view illustrating an ESD protection SCR device in accordance with an example embodiment of the present invention. A ESD protection SCR device illustrated below with reference to FIG. 4 is substantially identical to with the SCR device in FIG. 2, except that the SCR device further includes a shallow well 138 having N-type conductivity (indicated as SDNW). Only the shallow well 138 will be mainly described below in order to avoid any redundancy, and it should be understood that the description of like parts with respect to FIG. 2 applies mutandis mutandis.

Referring to FIG. 4, a ESD protection SCR device in accordance with an example embodiment of the present invention includes a semiconductor substrate 105 having P-type conductivity, an epitaxial layer 110, an element isolation layers 115, a first well 120, a first impurity region 125, a second well 140, a second impurity region 145, a floating well 170, and a shallow well 138.

The shallow well 138 is provided in the first well 120 and under a lower portion of a third impurity region 130. The shallow well 138 has an impurity concentration lower than that of the first well 120. Thus, the first well 120 of performing the base function among the PNP transistors includes the shallow well 138, thereby reducing the base resistance. As a result, the gain of the PNP transistor can be increased.

As described above, the SCR element for suppressing ESD includes the floating well capable of suppressing the loss of the horizontal current, which may occur due to the increase of the vertical current as the thickness of the epitaxial layer increases. When the SCR device is applied to a display and a power IC circuit, a desirable low area and high reliability may be effectively achieved.

Although the SCR devices have been described with reference to the specific embodiments, they are not limited thereto. Therefore, it will be readily understood by those skilled in the art that various modifications and changes can be made thereto without departing from the spirit and scope of the appended claims.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. § 112(f) are not to be invoked unless the specific terms "means for" or "step for" are recited in a claim.

What is claimed is:

1. An ESD protection SCR device comprising:
   an epitaxial layer provided on a semiconductor substrate having a P-type conductivity, the epitaxial layer having the P-type conductivity;
   a plurality of element isolation layers provided on the epitaxial layer, the plurality of element isolation layers arranged to divide the epitaxial layer into an anode region and a cathode region;
   a first well having an N-type conductivity, the first well provided in a portion of the epitaxial layer corresponding to the anode region;
   a first impurity region provided on a surface of the first well, the first impurity region being connected to an anode terminal and having the P-type conductivity at a level higher than semiconductor substrate;
   a second well having the P-type conductivity, the second well provided in a portion of the epitaxial layer corresponding to the cathode region;
   a second impurity region provided on a surface of the second well, the second impurity region being connected to a cathode terminal and having the N-type conductivity at a level higher than the first well; and
   a floating well having the N-type conductivity, buried in the epitaxial layer,
   wherein the floating well defines at least one opening therethrough, and the opening is filled with a material of the epitaxial layer having the P-type conductivity such that, when the epitaxial layer functions as a base of an NPN parasitic transistor, a resistance of the base is controlled.

2. The ESD protection SCR device of claim 1, wherein the floating well is disposed below both of the anode region and the cathode region.

3. The ESD protection SCR device of claim 1, wherein the second impurity region, the epitaxial layer and the first well define an emitter, a base and a collector, respectively, and the floating well is arranged to increase a resistance of the base and decrease a vertical current which flows along the epitaxial layer when the ESD protection SCR device is powered.

4. The ESD protection SCR device of claim 1, further comprising:
   a third impurity region having the N-type conductivity at a concentration higher than the first well, the third impurity region being provided on a surface of the first well so as to surround the first impurity region;
   a fourth impurity region having the P-type conductivity at a level higher than the semiconductor substrate, the fourth impurity region being provided on a surface of the second well so as to be spaced apart from the second impurity region and connected to a bulk terminal; and
   a fifth impurity region having the P-type conductivity at a level higher than the semiconductor substrate, the fifth impurity region being provided on the surface of the second well so as to surround one side of the second impurity region, adjacent to the anode region.

5. The ESD protection SCR device of claim 4, further comprising a shallow well having the N-type conductivity, the shallow well being positioned in the first well and under the third impurity region.

6. The ESD protection SCR device of claim 1, wherein the first well has a ring structure and surrounds the second well.

7. The ESD protection SCR device of claim 1, further comprising:
   a drift ion region of the N-type conductivity, provided at both sides of the first well; and
   a gate provided on both a surface of the second well and between the drift ion region and the fifth impurity region and a surface of the element isolation layer, the gate being connected to a gate terminal.

8. The ESD protection SCR device of claim 7, further comprising a P-body region disposed under a portion of the gate and a portion of the fifth impurity region.

9. The ESD protection SCR device of claim 1, wherein the element isolation layer additionally separate the epitaxial layer into a P-sub region, and further comprising:
   a third well having the P-type conductivity, the third well being disposed in the epitaxial layer of the P-sub region; and
   a sixth impurity region having the P-type conductivity, the sixth impurity region being provided on a surface of the third well and being connected to a P-sub terminal.

10. An ESD protection SCR device comprising:
    an epitaxial layer provided on semiconductor substrate having a P-type conductivity, the epitaxial layer having the P-type conductivity;
    an element isolation layer provided on the epitaxial layer, the element isolation layer separating the epitaxial layer into an anode region and a cathode region;
    a first well having an N-type conductivity and provided in a portion of the epitaxial layer corresponding to the anode region;

a first impurity region provided on a surface of the first well, the first impurity region being connected to an anode terminal and having a P-type conductivity higher than that of the semiconductor substrate;

a second well having the P-type conductivity and provided in a portion of the epitaxial layer corresponding to the cathode region;

a second impurity region provided on a surface of the second well, the second impurity region being connected to a cathode terminal and having the N-type conductivity at a level higher than that of the first well;

a floating well having the N-type conductivity, wherein the floating well is buried in the epitaxial layer; and a shallow well positioned at a lower portion of the first well and spaced apart from the first impurity region, the shallow well having the N-type conductivity, wherein the floating well defines at least one opening therethrough, and the opening is filled with a material of the epitaxial layer having the P-type conductivity such that, when the epitaxial layer functions as a base of an NPN parasitic transistor, a resistance of the base is controlled.

* * * * *